(12) United States Patent
Chindalore et al.

(10) Patent No.: US 7,195,983 B2
(45) Date of Patent: Mar. 27, 2007

(54) PROGRAMMING, ERASING, AND READING STRUCTURE FOR AN NVM CELL

(75) Inventors: Gowrishankar L. Chindalore, Austin, TX (US); James David Burnett, Austin, TX (US); Craig T. Swift, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 170 days.

(21) Appl. No.: 10/930,892

(22) Filed: Aug. 31, 2004

(65) Prior Publication Data

US 2006/0046406 A1 Mar. 2, 2006

(51) Int. Cl.
*H01L 21/336* (2006.01)
(52) U.S. Cl. ............ 438/301; 438/197; 438/300; 438/301; 438/694; 257/E21.209; 257/E21.634; 257/E21.636
(58) Field of Classification Search ............ None
See application file for complete search history.

(56) References Cited

U.S. PATENT DOCUMENTS

| | | | |
|---|---|---|---|
| 5,659,504 A | 8/1997 | Bude | |
| 6,313,486 B1 | 11/2001 | Kencke | |
| 6,621,131 B2 | 9/2003 | Murthy | |
| 6,710,465 B2 | 3/2004 | Song | |
| 6,713,810 B1 | 3/2004 | Bhattacharyya | |
| 6,735,124 B1 | 5/2004 | Melik-Martirosian | |
| 6,744,675 B1 | 6/2004 | Zheng | |
| 2003/0146458 A1 | 8/2003 | Horiuchi | |
| 2003/0206437 A1 | 11/2003 | Diorio | |
| 2004/0004859 A1* | 1/2004 | Forbes et al. | 365/185.05 |
| 2005/0110082 A1* | 5/2005 | Cheng et al. | 257/341 |

OTHER PUBLICATIONS

Related application filed Aug. 24, 2004.

* cited by examiner

*Primary Examiner*—Michael Lebentritt
*Assistant Examiner*—Kyoung Lee
(74) *Attorney, Agent, or Firm*—James L. Clingan, Jr.; Michael Balconi-Lamica

(57) ABSTRACT

A non-volatile memory (NVM) has a silicon germanium (SiGe) drain and a silicon carbon (SiC) source. The source being SiC provides for a stress on the channel that improves N channel mobility. The SiC also has a larger bandgap than the substrate, which is silicon. This results in it being more difficult to generate electron/hole pairs by impact ionization. Thus, it can be advantageous to use the SiC region for the drain during a read. The SiGe is used as the drain for programming and erase. The SiGe, having a smaller bandgap than the silicon substrate results in improved programming by generating electron/hole pairs by impact ionization and improved erasing by generating electron hole/pairs by band-to-band tunneling, both at lower voltage levels.

27 Claims, 5 Drawing Sheets

PROGRAMMING, ERASING, AND READING STRUCTURE FOR AN NVM CELL

FIELD OF THE INVENTION

This invention relates to semiconductor devices, and more particularly, to semiconductor device structures useful for non-volatile memory cells.

RELATED APPLICATIONS

Patent application Ser. No. 10/930,891, titled "Programming and Erasing Structure for an NVM Cell," assigned to the assignee hereof, and filed concurrently herewith.

RELATED ART

In non-volatile memories one of the issues has always been programming because of the elevated voltages required. As device structures decrease in size to improve transistor density and speed, the voltages have also decreased. Thus the need for reducing voltages, including programming voltages, has been becoming more significant, especially in embedded applications. The two typical approaches for programming have been tunneling and hot carrier injection (HCI). HCI, which generally has a lower voltage requirement, has generally been favored. In the case of HCI, current flows to generate hot carriers some of which have enough energy to overcome the barrier between the channel and the storage material. Thus lowering HCI voltages causes the rate at which carriers reach the storage material to lower as well. This has the effect of increasing programming time. This is also true for erasing which is often uses the hot hole injection type of HCI. A further issue is read disturb that occurs to cells that are not being read but are have voltage applied to them while another cell is being read. These voltages can cause a degradation of either the programmed or erased state.

Thus, there is a need for device structures that improve programming and erasing speed and/or reduce voltages for programming and erasing and/or improves read disturb.

BRIEF DESCRIPTION OF THE DRAWINGS

The present invention is illustrated by way of example and not limited by the accompanying figure, in which like references indicate similar elements, and in which.

Skilled artisans appreciate that elements in the figure are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a non-volatile memory (NVM) has a silicon germanium (SiGe) drain and a silicon carbon (SiC) source. The source being SiC provides for a stress on the channel that improves N channel mobility. The SiC also has a larger bandgap than the substrate, which is silicon. This results in it being more difficult to generate electron/hole pairs by impact ionization. Thus, it can be advantage to use the SiC region for the drain during a read. The SiGe is used as the drain for programming and erase. The SiGe, having a smaller bandgap than the silicon substrate results in improved programming by generating electron/hole pairs by impact ionization and improved erasing by generating electron hole/pairs by band-to-band tunneling, both at lower voltage levels. This is better understood by reference to the FIGS. and the following description.

Figure 1:
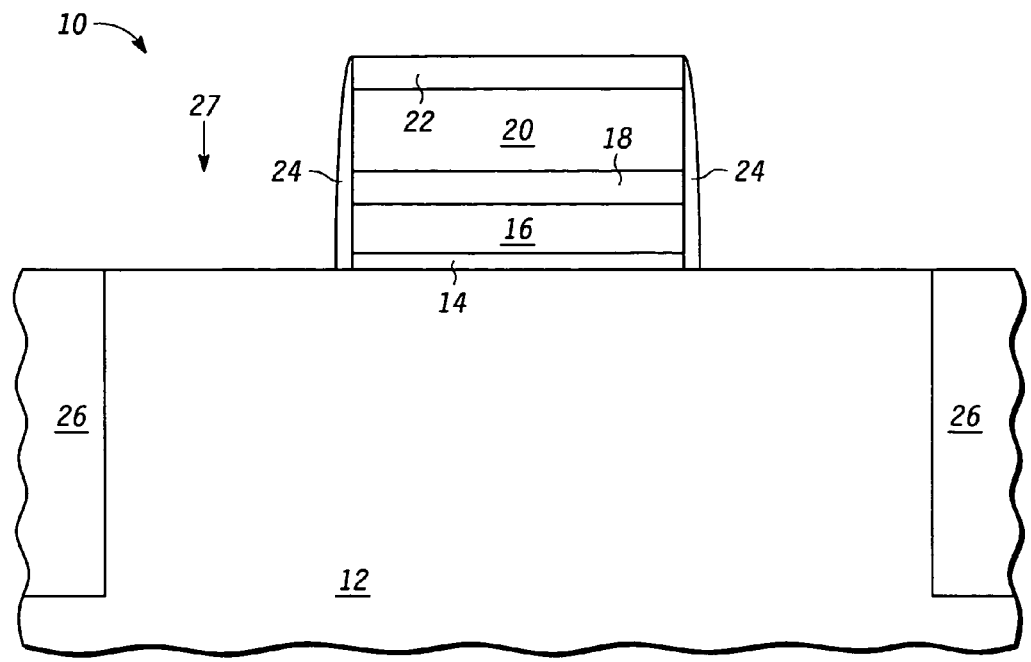
FIG. 1 is a cross section of a device structure at a stage in processing useful in producing the device structure according to a first embodiment of invention.

Shown in FIG. 1 is a device structure 10 comprising a substrate 12, a gate dielectric 14 on substrate 12; a storage layer 16 on gate dielectric 14; an interlayer dielectric 18; a gate 20 over interlayer dielectric 18; a capping layer 22 on gate 20; a sidewall spacer 24 around storage layer 16, interlayer dielectric 18, gate 20, and capping layer 22; and an isolation region 26 surrounding an active region 27. Substrate 12 is shown as a bulk substrate but could also be a silicon layer in a semiconductor on insulator (SOI) substrate. Substrate is preferably silicon but could potentially be a different semiconductor material. Gate 20 is preferably silicon but could be a different material or combination of materials such as metal layers of different types of metals. Gate dielectric 14 is preferably silicon oxide but could be a different material such as a high k dielectric. Storage layer 16 is preferably a layer of silicon nanocrystals surrounded by an insulator but could be something different such as silicon nitride or a polysilicon floating gate. Capping layer 22 is preferably nitride useful as an anti-reflective coating but could be a different material that etches selective to substrate 12. All of these layers 14, 16, 18, 20, and 22 could be made of multiple layers. Substrate 12 is shown as being exposed on both sides of gate 20 but could have a coating of material such as silicon oxide. Sidewall spacer 24 is relatively thin and is preferably nitride but other materials may also be used. This material should be able to be etched selective to silicon. A gate stack can mean gate 20 or gate 20 in combination with one or more of gate dielectric 14, storage layer 16, interlayer dielectric 18, capping layer 22, and sidewall spacer 24.

Figure 2:
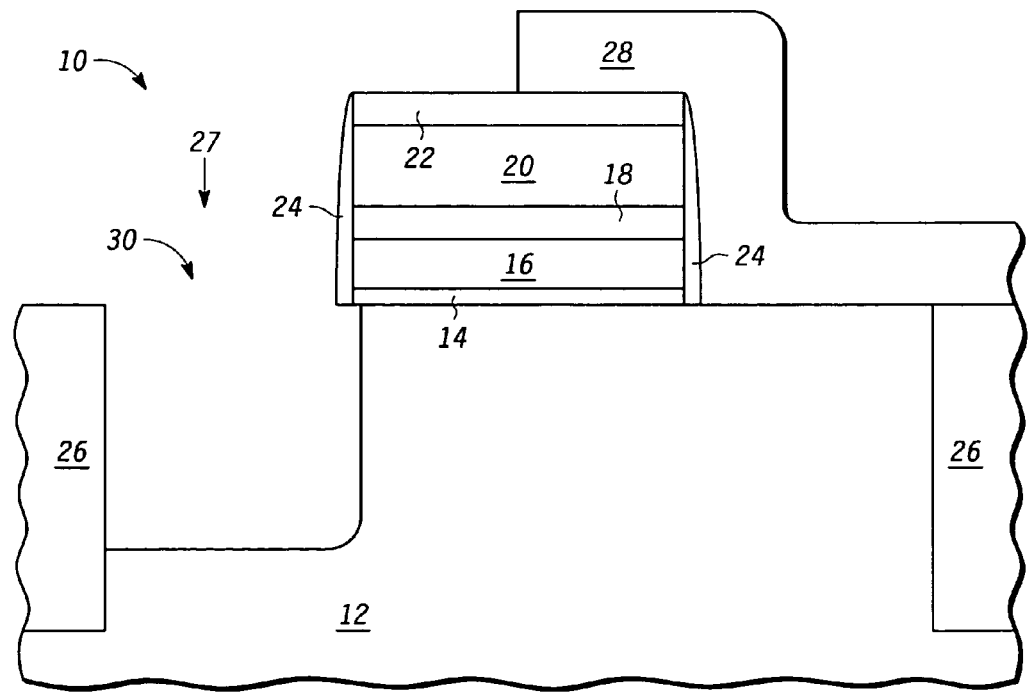
FIG. 2 is a cross section of the device structure of FIG. 1 at a stage in processing subsequent to that shown in FIG. 1.

Shown in FIG. 2 is device structure 10 after formation of a hard mask 28 over a portion of gate 20 and exposed substrate 12 on one side of gate 20 that leaves substrate 12 on the other side of gate 20 exposed and after an etch using hard mask 28 as a mask to form a cavity 30. Hard mask 28 is preferably silicon oxide but could be another material that etches selective to silicon. Also this material should be able to withstand the temperatures required for epitaxially growing silicon with carbon doping (SiC) and after enough selectivity for epitaxy. This etch is selective to capping layer 22, sidewall spacer 24, and hard mask 28. Such etches are well known in the art.

Figure 3:
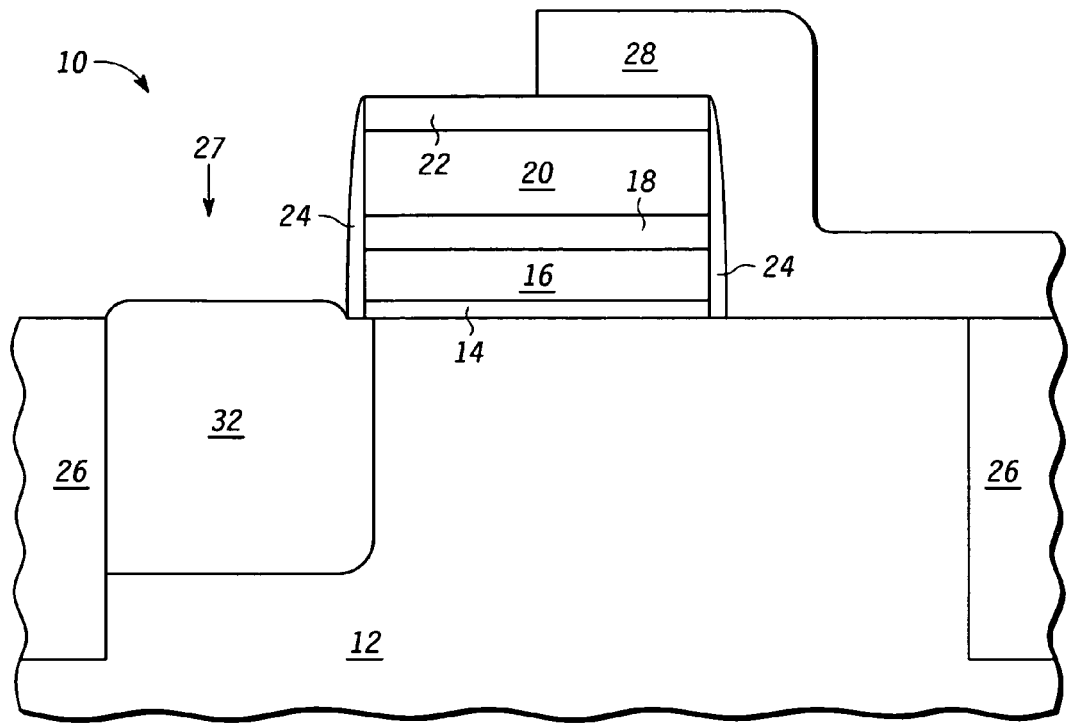
FIG. 3 is a cross section of the device structure of FIG. 2 at a stage in processing subsequent to that shown in FIG. 2.

Shown in FIG. 3 is device structure 10 after selectively and epitaxially growing a SiC region 32 in cavity 30. This SiC layer has the effect of creating a tensile stress in substrate 12 in active area 27.

Figure 4:
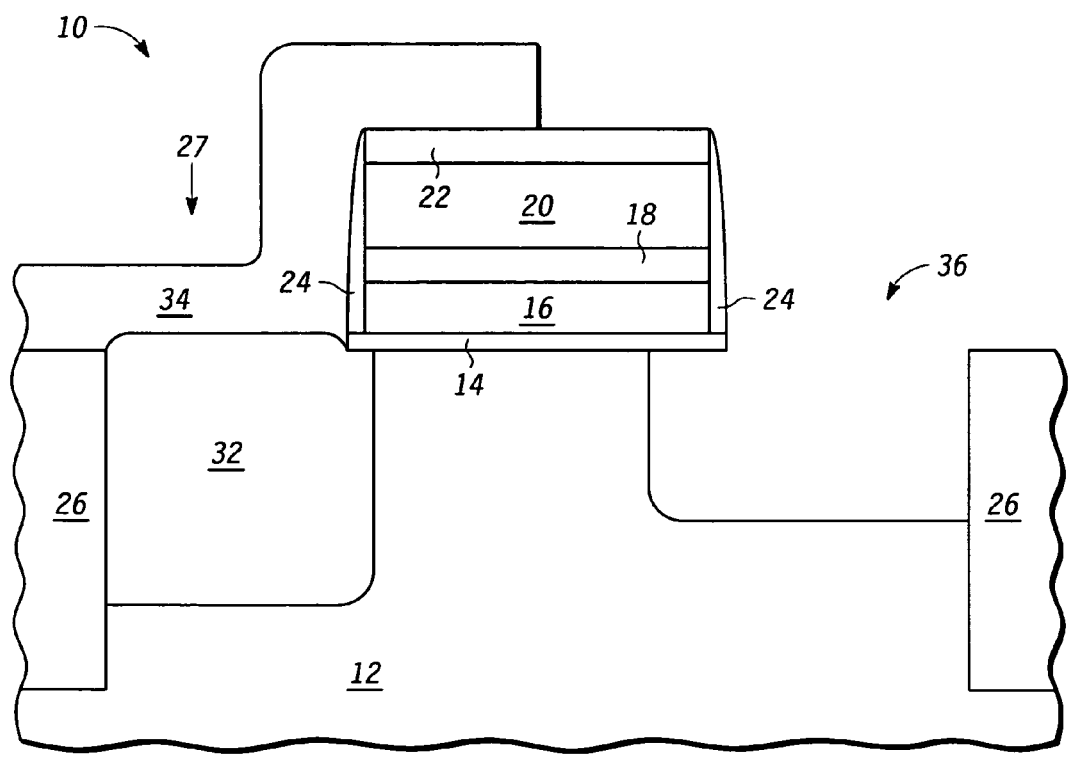
FIG. 4 is a cross section of the device structure of FIG. 3 at a stage in processing subsequent to that shown in FIG. 3.

Shown in FIG. 4 is device structure 10 after formation of a hard mask 34 that covers SiC region 32 and extends over a portion of gate 20 and an etch that uses hard mask 34 as a mask to etch into substrate 12 to form a cavity 36. Cavity 36 is not as deep as cavity of 30 but extends further under gate 20 than does cavity 30. The etches used for forming cavity 30 and cavity 36 both have isotropic and anisotropic aspects to them. The ratio of these aspects is adjustable. This is preferably achieved by first performing an anistropic etch followed by an isotropic etch. In the case of cavity 30 the anistropic etch is performed longer than is the anistropic etch for cavity 36. Conversely, the isotropic etch for cavity 36 is performed longer than for the isotropic etch for cavity 36. Using current technology, the length of gate 20 is preferably about 2000 Angstroms and cavity 36 preferably extends about 500 Angstroms under gate 20.

Figure 5:
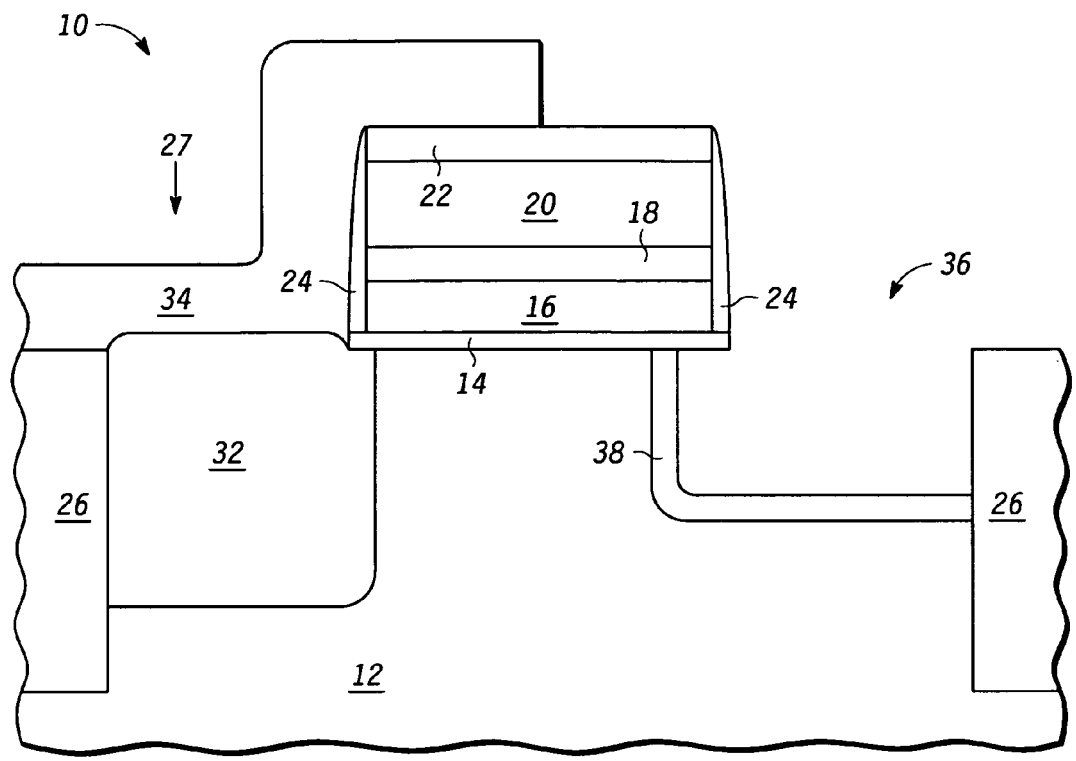
FIG. 5 is a cross section of the device structure of FIG. 4 at a stage in processing subsequent to that shown in FIG. 4.

Shown in FIG. 5 is device structure 10 after selectively growing an epitaxial SiGe layer 38 that is doped with P material, preferably boron. In this example, SiGe layer 38 is preferably about 250 Angstroms. This is a relatively low doping compared to source/drain contact doping levels but may be greater than that of substrate 12.

Figure 6:
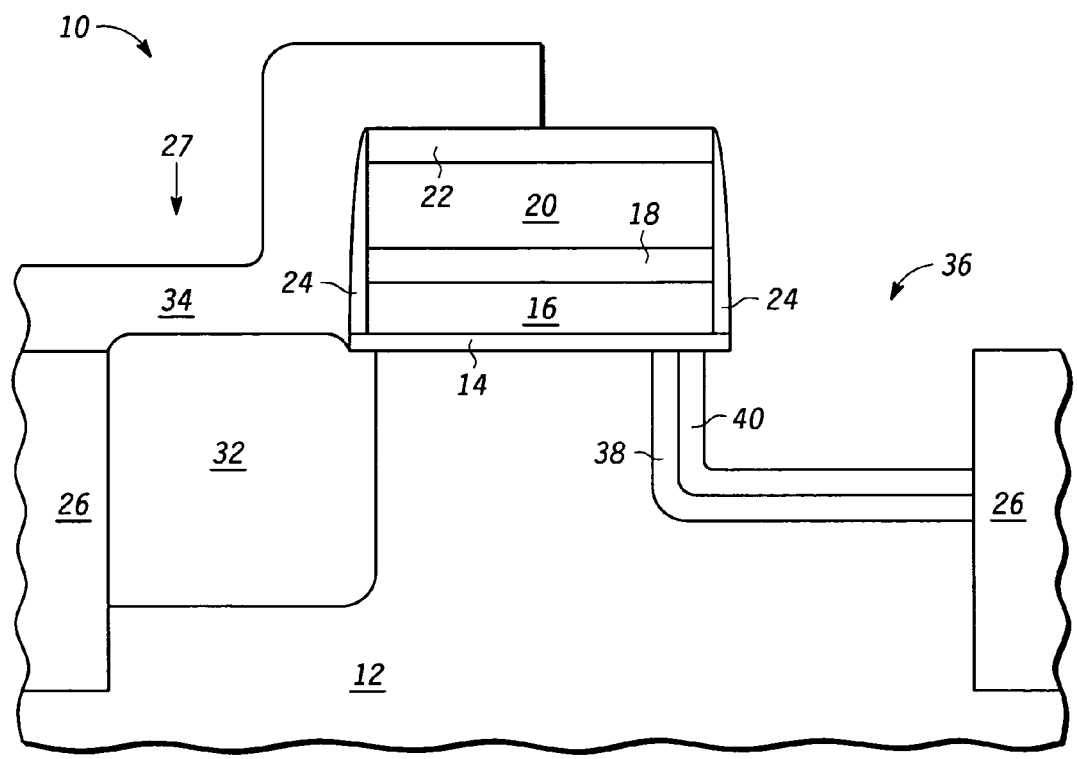
FIG. 6 is a cross section of the device structure of FIG. 5 at a stage in processing subsequent to that shown in FIG. 5.

Shown in FIG. 6 is device structure 10 after selectively growing an epitaxial SiGe layer 40, preferably to about 50 to 100 Angstroms, that is doped to N type, preferably arsenic, to limit diffusion. Phosphorus, however, could also be used. SiGe layer 40 can have a graded concentration of the N material beginning with a low concentration and increasing in concentration until SiGe layer 40 is completed. As an alternative, at the very beginning of growing SiGe layer 40, there may not be any N type material added, but after a short time the N material is added. When graded doping is used, supplemental angled implant using P-type dopant such as boron may be needed to achieve the desired junction characteristics. During the epitaxial growth, silicon and germanium are introduced to form a SiGe monocrystalline structure, and N-type material is also introduced, in situ, to obtain the N-type doping. With this in situ type doping, the grading can be controlled very well by controlling the introduction of the N material. This can be done as a continuous increase in doping or as a series of steps. P-type material such as boron may also diffuse into SiGe layer 40 aiding in the desired grading. Layer 40 is relatively thin to have a higher field concentrated in a narrow region. Supplemental angled boron implantation followed by annealing can be employed to diffuse boron into the SiGe from the silicon and make the PN junction in SiGe as narrow as desired.

Figure 7:
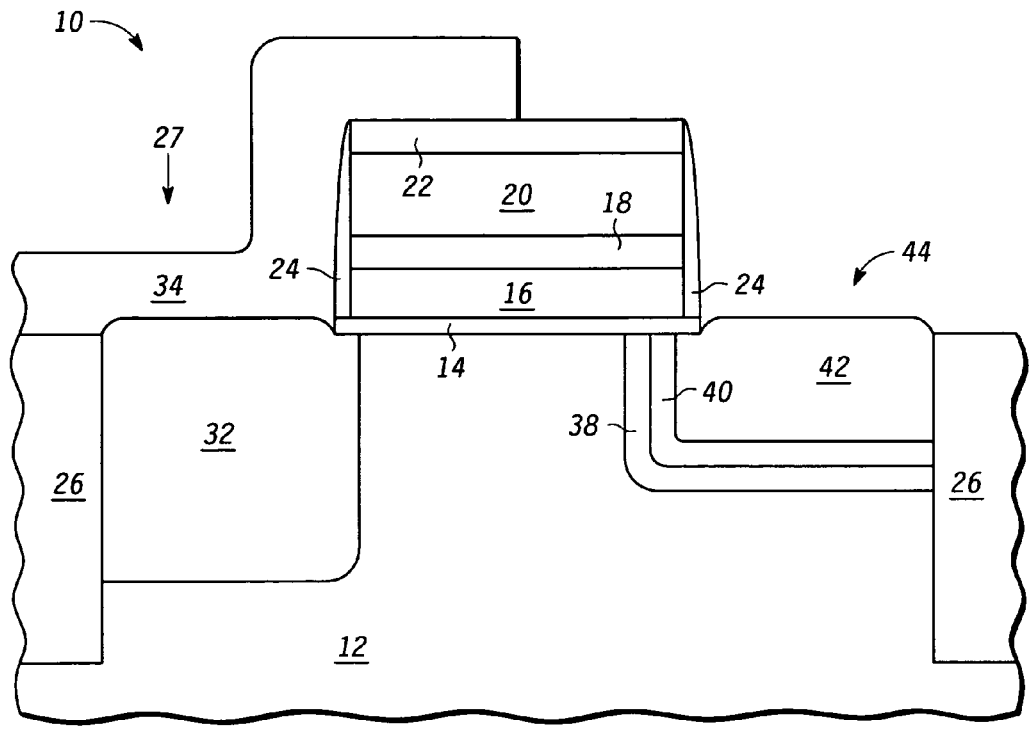
FIG. 7 is a cross section of the device structure of FIG. 6 at a stage in processing subsequent to that shown in FIG. 6.
Figure 8:
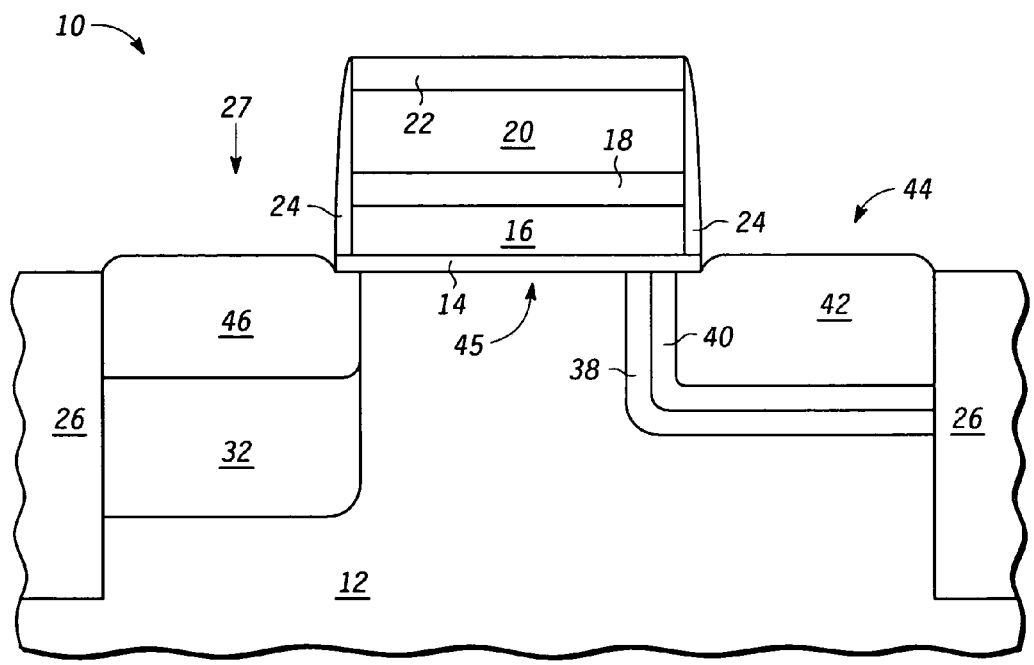
FIG. 8 is a cross section of the device structure of FIG. 7 at a stage in processing subsequent to that shown in FIG. 7.

Shown in FIG. 7 is device structure 10 after selectively and epitaxially growing a SiGe region 42 that completes the filling of opening 36. Although region 42 is characterized as being silicon and germanium, it may also be another semiconductor material such as just silicon. SiGe region 42 is relatively heavily doped to N type. Preferably SiGe layer 42 is doped to a concentration of about one time ten to the $20^{th}$ (1E20) atoms per centimeter cubed. Layers 38 and 40 and region 42 form a graded drain 44. This can be an alternative Shown in FIG. 8 is device structure 10 after removal of hard mask 34 and doping of SiC region 32 with N material to form source region 46. Source region 46 is formed by implantation while masking SiGe region 42. This masking can be achieved by simply using photoresist. A hard mask is not required in this embodiment but one could be used to achieve the resulting source region 46.

Although in practice additional steps are required, device structure 10 of FIG. 8 can be viewed as a fully functional non-volatile memory cell. Examples of additional steps included annealing to activate implants and interconnect layers to form contacts to the gate, source, and drain.

Programming is achieved by applying a positive voltage to gate 20 while substrate 12 is at ground or negative and by applying a voltage to drain 44 that is positive in relation to the voltage at source 46. An exemplary condition for programming in the case in which storage layer 16 is a floating gate is substrate 12 at minus 2 volts, gate 20 at 7 volts, drain 44 at 4 volts, and source 32 grounded. This causes current to flow from drain 42 to source 46, thus electrons flow in the opposite direction. The gate voltage must be high enough to cause the inversion of the portion 45 of substrate 12 immediately under gate dielectric 14 and between layer 38 and source 46. As is known for hot carrier injection (HCI), the current flowing between drain 44 and source 46 results in some of the electrons being energetic enough to reach storage layer 16. In the course of the electrons flowing, there are also hole/electron pairs formed by a phenomenon known as impact ionization of which there are two kinds; primary and secondary. These electrons so formed may also be energetic enough to reach storage layer 16. The electron/hole pairs generated by primary impact ionization are formed mostly in the drain very near the junction with the channel. In this case of device structure 10, these are going to occur mostly in layer 40 near layer 38. This electron/hole pair generation is based in part on the bandgap of the channel and drain material. In the past this material has generally been silicon but for device 10 this is SiGe, which has a smaller bandgap than substrate 12. Thus for the same bias conditions and substrate doping, the use of SiGe as the drain causes an increase in electron/hole formation by impact ionization.

Secondary impact ionization occurs as result of the holes that are formed from primary impact ionization. The holes are drawn back to substrate 12 and attempt to traverse the junction between layer 42 and layer 38. Due to their energy, these holes can cause another electron/hole pair to be generated and that electron so generated may also have enough energy to reach storage layer 16. Thus, similar for primary impact ionization, there are more electron/hole pairs by secondary impact ionization if the bandgap of the material is smaller. Thus layers 38 and 40 are SiGe to provide the lower bandgap compared to that of silicon. Due to layers 38 and 40 being SiGe more electrons will reach storage material 16 than if such layers were silicon. This can be used to reduce programming time, reduce bias voltages, or a combination of both.

For erase hot hole injection is used. The bias conditions are to have gate 20 at a low voltage compared to the substrate, source 46 be floating or grounded, drain 44 be positive relative to gate 20 and substrate 12. For storage layer 16 being a floating gate, exemplary conditions are gate 20 at minus 5 volts, substrate 12 at ground, drain 44 at 4 volts, and source 46 at ground. In this condition holes are generated in drain 44 and accelerated by the negative voltage of gate 20 to floating gate 16. Hole generation is based on a voltage differential across the drain and the bandgap of the drain material. An electron tunnels from the valence band to the conduction band leaving a hole in the valence band. The electric field across the drain-substrate PN junction can be optimized by an appropriately graded doping concentration in layer 40 compared to having the higher concentration present in region 42. Thus, the doping change across layer 40 results in a greater voltage differential across layer 40 which tends to generate more electron/ hole pairs. Also that layer 40 is silicon germanium decreases the bandgap compared to silicon to make band to band tunneling easier. This has the effect of reducing the voltage necessary to generate the electron/hole pairs. Thus, the bias voltages can be reduced to achieve the hot hole injection, the speed of erase can be increased, or some combination of both. Thus, for the erase case, device structure 10 benefits from both having a graded drain and a drain made from a material with a bandgap lower than that of the substrate.

Read is achieved in the normal fashion of applying a positive voltage and determining the conductivity between source/drain to some reference. If device structure has been programmed, then it will have a higher resistance than if it is in the erased condition. Read, however, can be performed by switching the source/drain function. Normally a read would occur with current flowing from drain 44 to source 32. This can be reversed and a benefit of reduced read disturb obtained. SiC region 32 has a larger bandgap than substrate 12 so that impact ionization risks are reduced during a read.

Figure 9:
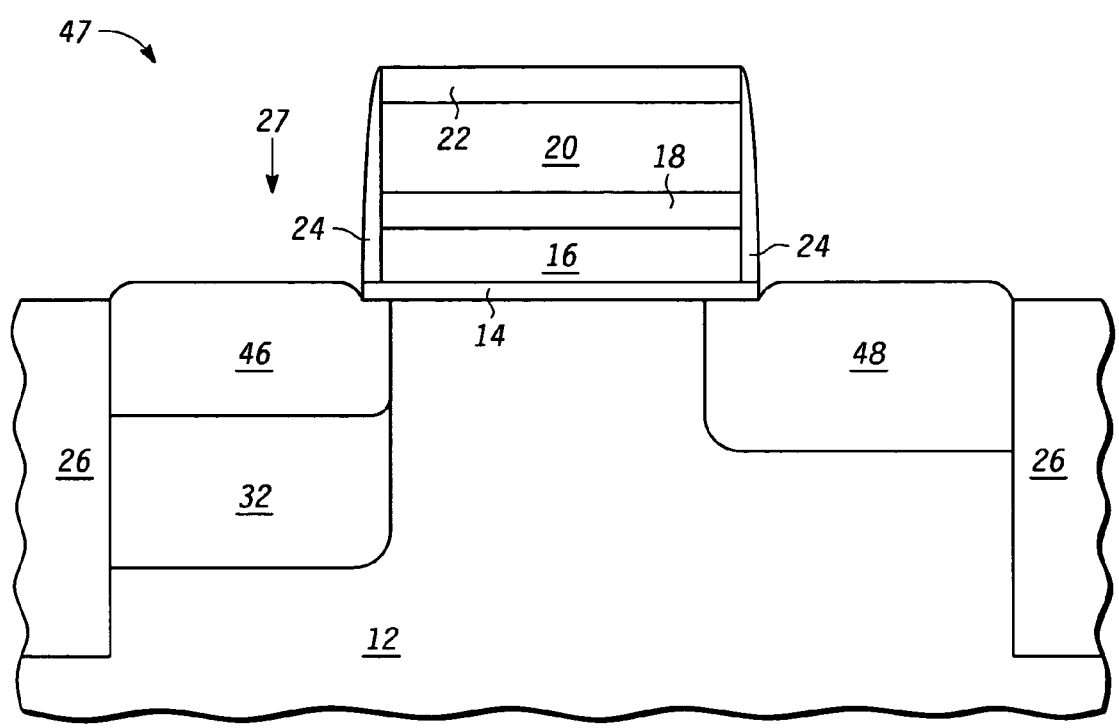
FIG. 9 is a cross section of a device structure as an alternative embodiment of the invention to that shown in FIG. 8.

Shown in FIG. 9 is a device structure 47 that is an NVM memory cell substantially similar to device structure 10 of FIG. 8 except that it is has a SiGe drain 48 that is formed as a continuous epitaxially grown layer after forming the opening for this drain formation. The numbering remains the same for common elements. No layer analogous to layer 38 is epitaxially grown for device structure 47. The opening formed prior to the epitaxial growth doesn't need to extend quite as far under gate 20 and the epitaxial growth of drain 48 does not have the grading of the N-type dopant used for a drain. Thus, the benefits of programming and erase due to SiGe are retained while providing for a simpler process at the sacrifice of the full benefits of layer 38 and the grading of the drain dopant. Programming, erasing, and reading are performed in the same manner as for device structure 10 of FIG. 8. In this device structure 47, the memory cell has the benefit relating to stress due to having a SiC source and a SiGe drain. Thus there are benefits of increased mobility and improved programming in conjunction with improved mobility.

In the foregoing specification, the invention has been described with reference to specific embodiments. However, one of ordinary skill in the art appreciates that various modifications and changes can be made without departing from the scope of the present invention as set forth in the claims below. Certain materials were described and these may be varied. As further alternatives, a layer analogous to layer 38 could be formed without grading the drain. Similarly, region 48 could be graded and not have a layer analogous to layer 38 present. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor device comprising:
   providing a substrate of a first conductivity type;
   forming a gate stack structure overlying the substrate;
   forming a drain region of a second conductivity type adjacent the gate stack structure, the second conductivity type being different from the first conductivity type, and wherein the drain region comprises a material having a smaller bandgap than a bandgap of the substrate; and
   forming a source region of a second conductivity type adjacent the gate stack structure and on a side opposite that of the drain region, wherein the source region comprises a material having a larger bandgap than the bandgap of the substrate.

2. The method of claim 1, wherein the source region comprises a material different from a material of the drain region.

3. The method of claim 1, wherein forming the source region includes epitaxially growing the larger bandgap material.

4. The method of claim 1, wherein forming the source region includes implanting to form the larger bandgap material.

5. The method of claim 1, wherein the source region comprises carbon doped silicon (SiC).

6. The method of claim 1, wherein the drain region comprises silicon germanium (SiGe).

7. The method of claim 1, wherein the first conductivity type comprises p-type and the device comprises an NMOS non-volatile memory transistor.

8. The method of claim 1, wherein the first conductivity type comprises n-type and the device comprises a PMOS non-volatile memory transistor.

9. The method of claim 1, wherein the gate stack structure includes gate electrode overlying a charge storage layer.

10. The method of claim 1, wherein the gate stack structure includes a gate electrode overlying a top dielectric layer, the top dielectric layer overlying a charge storage layer, and the charge storage layer overlying a bottom dielectric layer.

11. The method of claim 1, wherein the device comprises a non-volatile memory transistor, further wherein in response to applying a reading bias to the source region, a content of a charge storage layer of the non-volatile memory can be read with a minimal read disturb, the minimal read disturb corresponding to an occurrence of impact ionization insufficient to adversely affect the content of the charge storage layer.

12. The method of claim 1, wherein the larger bandgap material of the source region reduces an occurrence of impact ionization in the source region and substantially eliminates any low level charge injection to the gate stack structure that could undesirably affect a charge stored in a charge storage layer of the gate stack structure during a read operation with a biased source and grounded drain.

13. The method of claim 1, wherein the device comprises a non-volatile memory transistor, further wherein in response to applying a programming bias to the source region, a content of a charge storage layer of the non-volatile memory can be programmed by means of hot carrier injection.

14. A semiconductor device comprising:
   a substrate of a first conductivity type;
   a gate stack structure overlying the substrate;

a drain region of a second conductivity type adjacent the gate stack structure, the second conductivity type being different from the first conductivity type, and wherein the drain region comprises a material having a smaller bandgap than a bandgap of the substrate; and a source region of a second conductivity type adjacent the gate stack structure and on a side opposite that of the drain region, wherein the source region comprises a material having a larger bandgap than the bandgap of the substrate.

15. The device of claim 14, wherein the source region comprises a material different from a material of the drain region.

16. The device of claim 14, wherein the source region includes an epitaxially grown material.

17. The device of claim 14, wherein the source region includes a material with an implanted dopant.

18. The device of claim 14, wherein the source region comprises carbon doped silicon (SiC).

19. The device of claim 14, wherein the drain region comprises silicon germanium (SiGe).

20. The device of claim 14, wherein the first conductivity type comprises p-type and further wherein the device comprises an NMOS non-volatile memory transistor.

21. The device of claim 14, wherein the first conductivity type comprises n-type and further wherein the device comprises a PMOS non-volatile memory transistor.

22. The device of claim 14, wherein the gate stack structure includes gate electrode overlying a charge storage layer.

23. The device of claim 14, wherein the gate stack structure includes a gate electrode overlying a top dielectric layer, the top dielectric layer overlying a charge storage layer, and the charge storage layer overlying a bottom dielectric layer.

24. The device of claim 14, wherein the device comprises a non-volatile memory transistor, further wherein in response to applying a reading bias to the source region, a content of a charge storage layer of the non-volatile memory can be read with a minimal read disturb, the minimal read disturb corresponding to an occurrence of impact ionization insufficient to adversely affect the content of the charge storage layer.

25. The device of claim 14, wherein the larger bandgap material of the source region reduces an occurrence of impact ionization in the source region and substantially eliminates any low level charge injection to the gate stack structure that could undesirably affect a charge stored in a charge storage layer of the gate stack structure.

26. The device of claim 14, wherein the device comprises a non-volatile memory transistor, further wherein in response to applying a programming bias to the source region, a content of a charge storage layer of the non-volatile memory can be programmed by means of hot carrier injection.

27. The method of claim 1, wherein:
the step of forming the source is further characterized by the source comprising carbon doped silicon; and
the step of forming the drain is further characterized by the drain comprising germanium doped silicon.

* * * * *